United States Patent
Koudele et al.

(10) Patent No.: US 8,522,087 B2
(45) Date of Patent: Aug. 27, 2013

(54) ADVANCED CONVERTERS FOR MEMORY CELL SENSING AND METHODS

(75) Inventors: Larry J. Koudele, Erie, CO (US); Robert B. Eisenhuth, Boulder, CO (US)

(73) Assignee: Micron Technology, Inc., Boise, ID (US)

(*) Notice: Subject to any disclaimer, the term of this patent is extended or adjusted under 35 U.S.C. 154(b) by 289 days.

(21) Appl. No.: 13/019,873

(22) Filed: Feb. 2, 2011

(65) Prior Publication Data

US 2012/0194221 A1 Aug. 2, 2012

(51) Int. Cl.
*G06K 5/04* (2006.01)

(52) U.S. Cl.
USPC ........... 714/700; 714/701; 714/801; 341/118; 375/371

(58) Field of Classification Search
USPC .......... 714/700, 701, 798; 341/118; 375/371
See application file for complete search history.

(56) References Cited

U.S. PATENT DOCUMENTS

| | | | |
|---|---|---|---|
| 3,763,317 A * | 10/1973 | Coleman et al. | 327/154 |
| 4,338,569 A | 7/1982 | Petrich | |
| 4,543,516 A * | 9/1985 | Kobori et al. | 388/813 |
| 4,922,141 A | 5/1990 | Lofgren et al. | |
| 4,998,109 A | 3/1991 | LeChevalier | |
| 5,229,752 A * | 7/1993 | Gliebe et al. | 340/658 |
| 5,432,513 A * | 7/1995 | Okamoto | 341/108 |
| 6,590,426 B2 * | 7/2003 | Perrott | 327/7 |
| 7,305,025 B2 * | 12/2007 | Yamaguchi et al. | 375/226 |
| 7,730,366 B2 * | 6/2010 | Nakamura et al. | 714/700 |

* cited by examiner

*Primary Examiner* — Esaw Abraham
(74) *Attorney, Agent, or Firm* — Pritzkau Patent Group, LLC

(57) ABSTRACT

A counter configuration operates in cooperation with a delay configuration such that the counter configuration counts an input interval based on a given clock speed and a given clock interval while the delay configuration provides an enhanced data output that is greater than what would otherwise be provided by the given clock speed. The counter configuration counts responsive to a selected edge in the clock interval. An apparatus in the form of a correction arrangement and an associated method are configured to monitor at least the delay configuration output for detecting a particular time relationship between an endpoint of the input interval and a nearest occurrence of the selected clock edge in the given clock signal that is indicative of at least a potential error in the enhanced data output and determining if the potential error is an actual error for subsequent use in correcting the enhanced data output.

30 Claims, 10 Drawing Sheets

ADVANCED CONVERTERS FOR MEMORY CELL SENSING AND METHODS

BACKGROUND

The present application is generally related to the fields of memory cell sensing and analog to digital converters and, more particularly to an apparatus and method for enhancing the resolution of an analog to digital converter and/or enhancing memory cell sensing.

U.S. Pat. No. 4,998,109 is one example of a prior art technique that utilizes a delay line for purposes of enhancing the resolution of an analog to digital converter beyond the limitation that is imposed through the use of a given clock or reference frequency. That is, the resolution is increased to a value that is greater than the resolution that would otherwise be provided through the use of the given clock frequency alone. Applicant recognizes, however, that the use of such a prior art technique is problematic under certain circumstances that can take place during the operation of the analog to digital converter, as will be described in detail below.

The foregoing examples of the related art and limitations related therewith are intended to be illustrative and not exclusive. Other limitations of the related art will become apparent to those of skill in the art upon a reading of the specification and a study of the drawings.

BRIEF DESCRIPTION OF THE DRAWINGS

Exemplary embodiments are illustrated in referenced figures of the drawings. It is intended that the embodiments and figures disclosed herein are to be illustrative rather than limiting.

DETAILED DESCRIPTION

The following description is presented to enable one of ordinary skill in the art to make and use the invention and is provided in the context of a patent application and its requirements. Various modifications to the described embodiments will be readily apparent to those skilled in the art and the generic principles taught herein may be applied to other embodiments. Thus, the present invention is not intended to be limited to the embodiment shown, but is to be accorded the widest scope consistent with the principles and features described herein including modifications and equivalents. It is noted that the drawings are diagrammatic in nature in a way that is thought to best illustrate features of interest. Descriptive terminology has been adopted for purposes of enhancing the reader's understanding and is in no way intended as being limiting.

Figure 1:
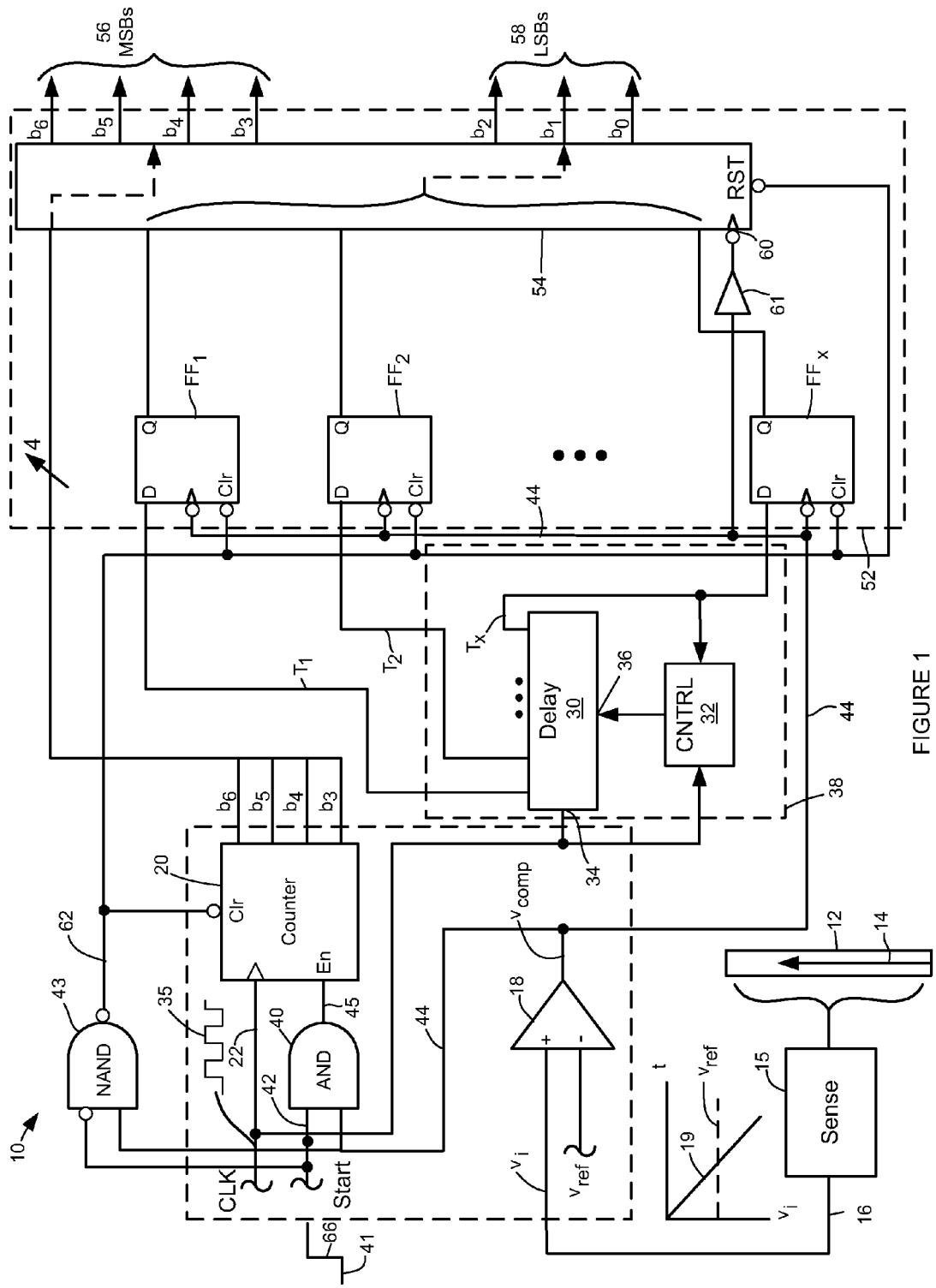
FIG. 1 a block diagram of one embodiment of a digital to analog converter according to the present disclosure.

Attention is now directed to the figures wherein like reference numbers may be used to refer to like components throughout the various figures. FIG. 1 is a block diagram of an analog to digital (A/D) system, generally indicated by the reference number 10, which illustrates one embodiment for sensing (e.g., reading or program verifying) a state of (e.g., a value stored in) a memory cell 12. In the present example, the memory cell is a flash memory cell previously having a specific amount of charge 14, indicated by an arrow, stored therein. It should be appreciated that memory cell 12 can be of many different types including, but not limited to Flash, Phase Change, and essentially any type of memory cell that stores information that is measurable responsive to some analog (e.g., essentially continuously variable) value, whether currently available or yet to be developed. While the present example may use the term "charge" in the context of a nonvolatile memory as the continuously variable value, it is to be understood that any suitable continuously variable value can be employed as exhibited by an suitable type of memory and that the present descriptions are provided by way of example and are not intended to be limiting with respect to the use of electrical charge as the continuously variable value.

System 10 receives a number of inputs including a sense signal, such as voltage input value $V_i$, from sense circuitry, such as a sense amplifier 15. Input voltage $V_i$ is produced by the sense amplifier responsive to charge 14 in memory cell 12. A comparator 18 receives $V_i$ as well as a reference voltage $V_{ref}$. Sense amplifier 15 produces $V_i$ as a ramp output 19 having a slope and magnitude endpoints are responsive to the possible values of charge 14. It is noted that the term "magnitude endpoints" refers to voltage values at either end of the ramp at least for the reason that the ramp does not necessarily start at zero voltage. The value of the reference voltage can be based, for example, on the slope of $V_i$ for the slowest ramp to be measured, as well as the maximum time for one conversion cycle. In the present example, ramp output 19 is illustrated as negative going, although this is not a requirement. It is noted that comparator 18 changes output states when $V_i$ crosses $V_{ref}$. A counter 20 receives a clock signal CLK at a clock input 22. In the present example, a synchronous type counter is used. It is noted that such synchronous counters are well known. The clock signal is also routed to a delay line 30 and to a controller 32. The latter also receives an output $T_x$ where x is equal to the total number of phase outputs (e.g., taps thru the full delay) of the delay line and where the clock interval is divided into a number of increments by using the delay line in order to achieve a desired number of bits of resolution N within one clock period. It is noted that delay line 30 includes output taps $T_1$-$T_x$. An input 34 of the delay line receives the CLK signal such that clock pulses 35 propagate through the delay line and are successively output on each tap. Controller 32 provides an output to a control input 36 of the delay line. The controller is configured to adjust the total delay of the delay line to match one-half the period of the clock signal CLK. Thus, the delay line is locked to CLK in this manner to form a Delay Locked Loop (DLL) configuration. With respect to the frequency of the CLK signal and by way of example, in order to achieve 7 bit resolution, the time domain window of interest is divided into 128 increments. Of course, four bit counter 20 can be configured to divide that time period into 16 equal intervals. In other embodiments, the counter could be more than four bits, or less than four bits, depending on the overall resolution that is needed. In order to obtain a total of 128 increments, in the present example, each one of the 16 intervals can then be divided by 8 in a manner that is described below. Additional connections of the output taps of the delay line will be described an appropriate point below. It is noted that delay line 30 and controller 32 are part of a delay section 38, within a dashed line.

During operation, an AND gate 40 receives a Start signal 41 on a line 42 and receives the output of comparator 18 on a line 44. The start signal is also provided to an inverted input of a reset NAND gate 43 with the other input of the reset NAND gate also receiving the comparator output. An output 45 of AND gate 40 is connected to an enable input of counter 20. Initially, both inputs of AND gate 40 are high to enable counter 20. The AND gate 40, counter 20 and comparator 18 form parts of an input and MSB arrangement (e.g., section) that can also include any other components that may be used in order to sense (e.g., read or program verify) memory cell 12 such as, for example, sense amp 15 and a multiplexer (not shown in the current figure) which provides for selectively sensing from one of a plurality of memory cells. The output of comparator 18 is also routed to the clock (CLK) input of each one of a set of D type flip-flops that are indicated by the reference numbers $FF_1$ through $FF_x$. Note that the number of flip-flops is equal to the value of x. That is, four flip-flops provides for unambiguous decoding although a greater number of flip-flops could be used. Accordingly, for a 3 bit decode (N=3), four flip-flops can be used (where x=4). It is also noted that an inverter is provided at the clock input of each flip-flop with the D input of each of flip flops $FF_1$-$FF_x$ connected to a respective one of output taps $T_1$-$T_x$. An LSB and decode arrangement (e.g., section) 52, shown within a dashed line, can include these flip-flops and a decoder 54. The latter receives the most significant bits from counter 20 and uses them in conjunction with the flip flop outputs to produce an overall output of MSBs 56 and LSBs 58. Decoder 54 includes an inverted latch input 60 which receives the output of comparator 18 via a buffer 61 for purposes of latching the LSBs. It is noted that buffer 61 is provided to introduce a delay, such as one that is sufficient to allow the D outputs of flip-flops $T_1$-$T_x$ to stabilize before being latched. An output 62 of reset NAND gate 43 is inverted and provided to clear (Clr) inputs of counter 20, Clr inputs of flip flops $FF_1$-$FF_x$, and a reset (RST) input of decoder 54.

System operation can be initiated by a transition 66 in start signal 41 feeding AND gate 40. It should be noted that the start signal will be synchronous with the clock, so that a full clock cycle passes before the counter counts up the first time. Accordingly, the Start signal causes counter 20 to begin counting CLK pulses. In the present example of a 4 bit counter, up to 16 pulses can be counted. At the same time, $V_{ref}$ is provided to comparator 18. When comparator 18 changes state responsive to $V_i$ crossing $V_{ref}$, AND gate 40 changes its output state to logic low which terminates the counting interval of counter 20. It should be appreciated that the termination of the operation of counter 20 can take place at any time during a clock period and that the termination of the count will not generally coincide with the initiation of a clock pulse. On this basis, counter 20 outputs four bits $b_6$-$b_3$ which represent the four most significant bits of the final value that is to be determined, if it is assumed that the final value will include 7 bits. As will be seen, additional circuitry is configured in a way which enhances resolution by determining more precisely when the count is terminated within a single clock period.

In order to establish with significant accuracy when the count was terminated within the single clock period (e.g., the portion of a single clock period that has elapsed at the time of termination of the count by comparator 18), the output of comparator 18 can be simultaneously provided to the CLK input of flip flops $FF_1$-$FF_x$. Each flip flop responds to its D input depending upon its clock input. In the present example, the flip flops can be edge triggered such that they respond to the negative going edge of clock signal CLK. The resulting states of the flip flops depend upon the relationship between the time at which the clock edge arrives at each tap of delay line 30 (as the clock edge propagates through the delay line) and the time at which comparator 18 changes its output state, as received by the CLK input of each flip flop. That is, all flip flops that receive the positive going edge of the clock from their respective delay line tap before their CLK input changes states can output (e.g., latch, exhibit, etc.) a high logic state, for example, whereas all flip flops that receive the negative going edge of the clock from their respective delay line tap before their CLK input changes states can output a low logic state, for example. Table 1 sets forth a listing of output states for the exemplary use of four flip flops $FF_1$-$FF_4$ (where x=4, in this example) such that eight potential output states, S1-S8, are defined.

TABLE 1

| | Flip Flop Outputs | | | |
| --- | --- | --- | --- | --- |
| Output State | $FF_1$ | $FF_2$ | $FF_3$ | $FF_4$ |
| S1 | 0 | 0 | 0 | 0 |
| S2 | 1 | 0 | 0 | 0 |
| S3 | 1 | 1 | 0 | 0 |
| S4 | 1 | 1 | 1 | 0 |
| S5 | 1 | 1 | 1 | 1 |
| S6 | 0 | 1 | 1 | 1 |
| S7 | 0 | 0 | 1 | 1 |
| S8 | 0 | 0 | 0 | 1 |

Table 2 sets forth the fractional value of a clock period that is represented by each state S1-S8 of Table 1.

TABLE 2

| Output State | Approximate Fractional Value of one clock period | LSBs |
|---|---|---|
| S1 | 0 | 000 |
| S2 | 1/8 | 001 |
| S3 | 1/4 | 010 |
| S4 | 3/8 | 011 |
| S5 | 1/2 | 100 |
| S6 | 5/8 | 101 |
| S7 | 3/4 | 110 |
| S8 | 7/8 | 111 |

Accordingly, it should be appreciated that the provision of 8 output states represents three bits of resolution within each clock period, as is also listed in Table 2 corresponding to the LSBs of the value being determined. The outputs of flip flops $FF_1$-$FF_x$ are provided to a decoder 54 along with the four most significant bits from counter 20. The decoder can effectively append the three LSBs, from Table 2, as $b_0$-$b_2$ to the four most significant bits $b_3$-$b_6$. It should be mentioned that the additional three bits of resolution, as described in detail above, have been provided without the need to increase the overall clock frequency of the system and without the need for increasing the number of bits of counter 20 while using what is thought to be a relatively minimal amount of additional circuitry. The additional resolution is effectively provided in a way which can be thought of as traveling or directed to a particular clock period of interest. For example, that clock period is the clock period during which counter 20 is stopped. The flip-flops that are determinative of the LSBs are advantageously idle while counter 20 is engaged in counting. Such supplemental resolution can be provided irrespective of the specific number of bits by which counter 20 counts. It should also be appreciated that the teachings herein are considered to be applicable in conjunction with the use of other types of underlying devices and are not limited to use with counters.

Still referring to FIG. 1, a reset of counter 20, flip flops $FF_1$-$FF_x$, and decoder 54 takes place when the start signal transitions low (i.e., deasserted) and the output of comparator 18 is high. This reset condition is maintained so long as this state remains.

Figure 2A:
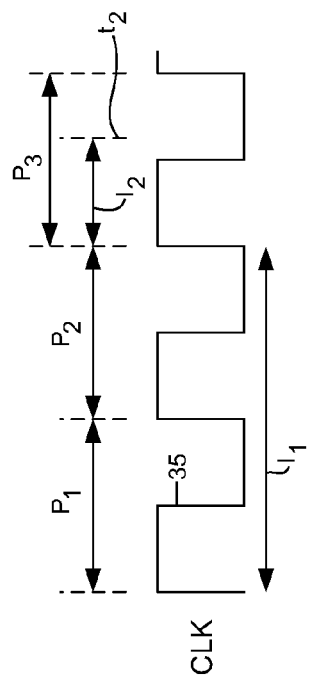
FIG. 2a is a plot of a clock signal showing particular time intervals that are of interest relative to determining the time duration of an input interval that is to be converted to digital form.

Turning to FIG. 2a in conjunction with FIG. 1, one exemplary situation is illustrated with respect to CLK in order to further clarify the operation of the described circuitry. In particular, a number of clock pulses (e.g., corresponding to clock periods $p_1$ and $p_2$) have taken place and counted by counter 20 over an interval $I_1$. The output of comparator 18, however, changes state at a time $t_2$ during period $p_3$, such that the LSB circuitry measures an interval $I_2$ that represents an initial portion of $p_3$. Thus, the MSBs are determined based on $I_1$ and the LSBs are determined based on $I_2$.

Figure 2B:
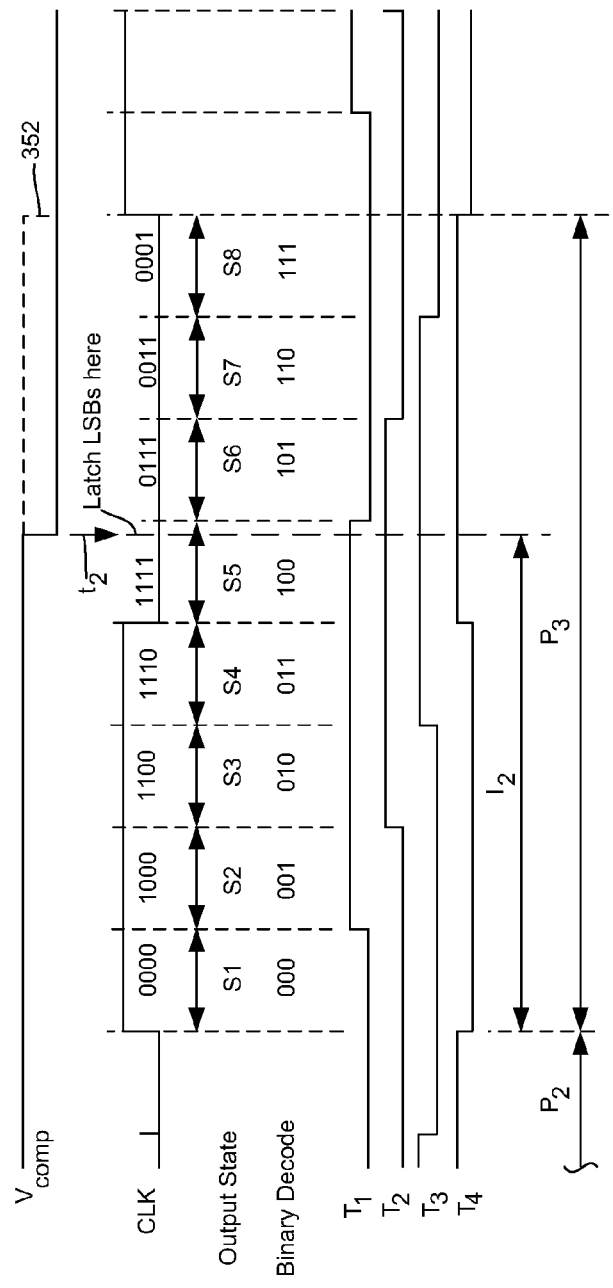
FIG. 2b is a timing diagram illustrating an input time interval and a clock signal that is used in converting the input time interval to digital form and also illustrating the phase outputs of a delay configuration along with a number of intervals that are of interest according to the present disclosure.

FIG. 2b is a timing diagram that is an enlarged view of a portion of period $p_2$ and period $p_3$ of FIG. 2, shown in time relation to the voltage waveforms on output taps $T_1$-$T_4$ from delay line 30. The CLK signal is also shown along with the flip-flop latch values for states S1-S8, also given in Table 1. Further, the associated binary decode value for each state is shown, also given in Table 2. In the present example, it can be seen that the comparator changes output states at a time $t_2$ during the 1111 increment of the $p_2$ clock period corresponding to a binary decode value of 100.

Figure 2C:
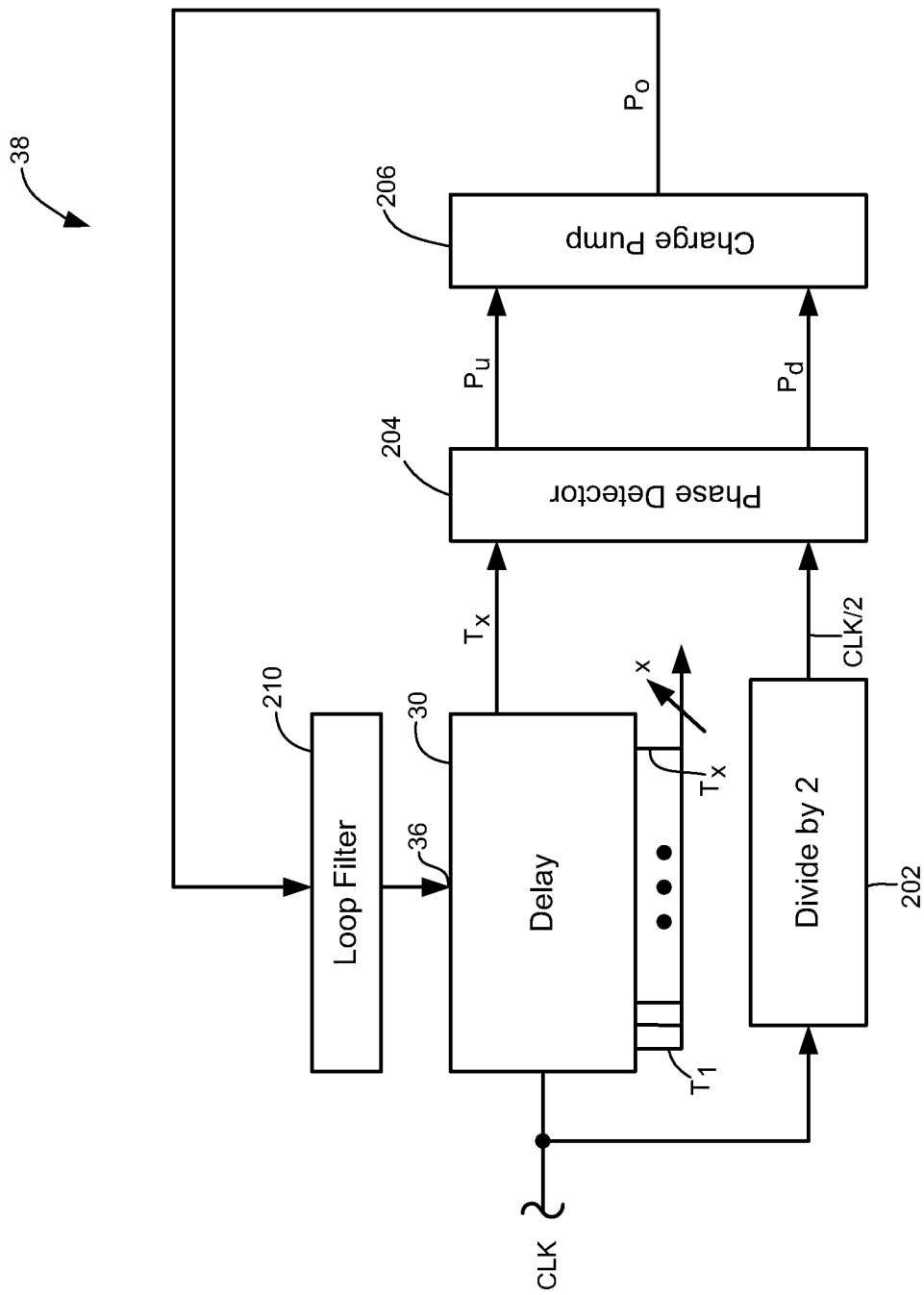
FIG. 2c is a block diagram of one embodiment of a delay section according to the present disclosure.

Referring to FIG. 2c in conjunction with FIG. 1, one embodiment of a delay section 38 is shown in a block diagram form. Delay Line 30 is again shown in FIG. 2c along with components that can make up controller 32 of FIG. 1. In this example, controller 32 includes a divide by two counter 202 which receives the CLK signal as its input and produces a CLK/2 output. It is noted that the use of a divide by two counter is based on an exemplary implementation of a phase detector as described below.

Still referring to FIG. 2c, a phase detector 204 receives the output of tap $T_x$ (e.g., phase x) from delay line 20 along with the output of divide by 2 counter 202. The $T_x$ output and divide by two output are compared by phase detector 204 to produce a pump up signal $P_u$ and a pump down signal $P_d$, both of which are provided to a charge pump 206. The latter then provides a charge pump output $P_o$ to a loop filter 210. The loop filter, in turn, drives a control input 36 of the delay line which causes the total delay of the delay line to correspond to one half of one period of the CLK signal. It should be appreciated that the use of a charge pump and loop filter in a delay locked loop configuration represents one embodiment that is not intended as being limiting. Modern PLLs (Phase Locked Loops) and DLLs are typically fully digital. It is noted that details with respect to the operation and components of such a delay locked loop configuration are well known in the art, as taught for example, by U.S. Pat. Nos. 4,338,569 and 4,922,141.

Figure 3:
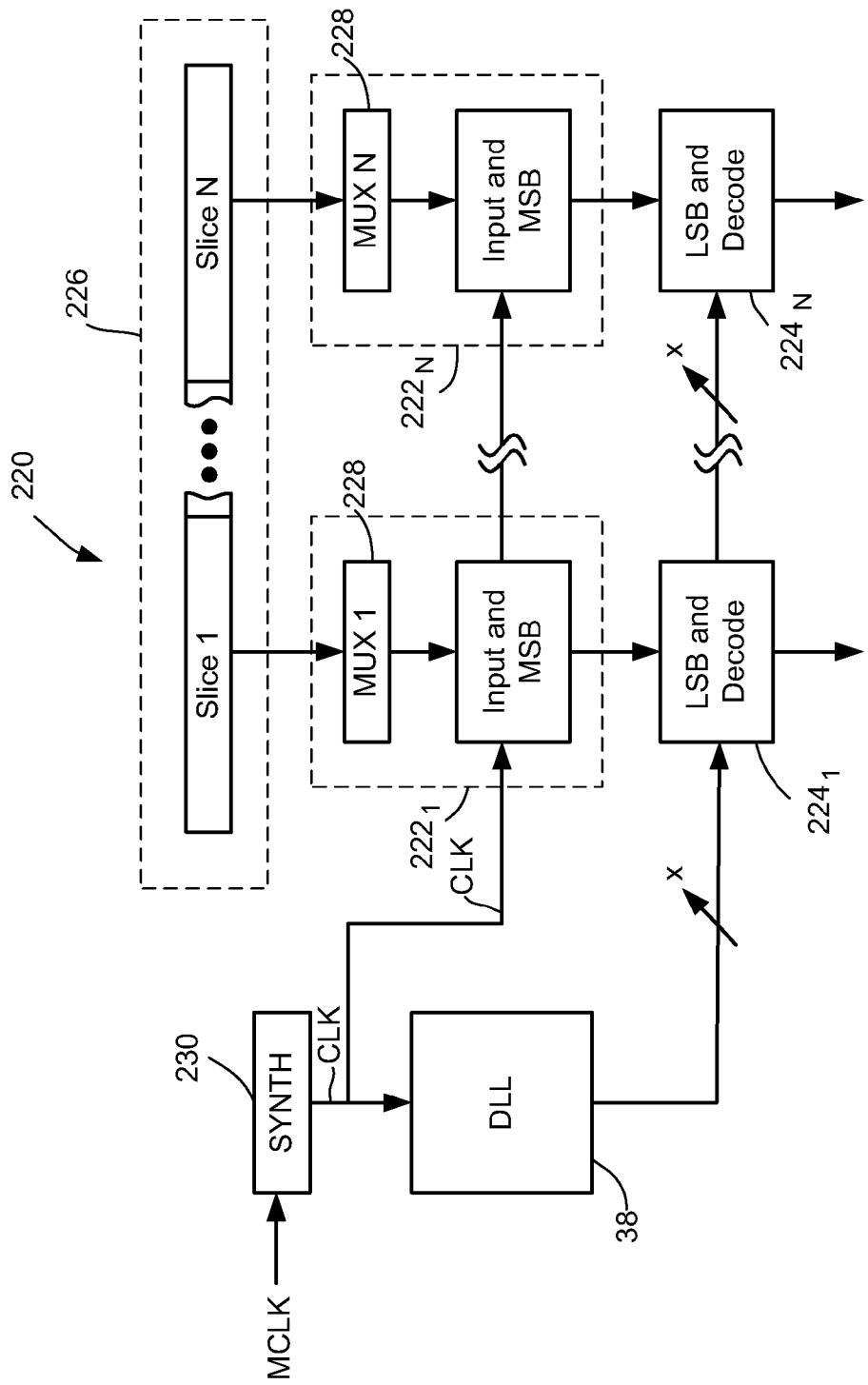
FIG. 3 is a block diagram of one embodiment of a system produced according to the present disclosure having a delay section, a plurality of input and MSB arrangements and a plurality of LSB and decode arrangements.

Attention is now directed to FIG. 3 which illustrates one embodiment of a system 220 that is produced in accordance with the present disclosure and which incorporates delay section 38, a plurality of input and MSB arrangements which may be referred to collectively using the reference number 222 and a plurality of LSB and decode arrangements which may be referred to collectively using the reference number 224 and each of which may be referred to individually with subscripts appended as appropriate based on slice numbers. In this embodiment, an overall memory 226 is handled in slices that are indicated as slice 1 through slice N. Each slice is sensed using an associated combination of an input and MSB arrangement along with an LSB and decode arrangement. For example, slice 1 is handled by input and MSB arrangement $222_1$ and LSB and decode arrangement $224_1$. It is noted that a multiplexer 228 forms part of each input and MSB arrangement for use in selectively sensing the memory cells of each memory slice. A frequency synthesizer 230 receives a master clock signal MCLK and generates the output CLK. The use of a frequency synthesizer provides a programmable range of CLK frequencies, assuming that the input master clock frequency is fixed. Therefore, the use of a frequency synthesizer is convenient in that regard, but is not a requirement. Additionally, such frequency synthesizers are well known and therefore familiar to one of ordinary skill in the art. The CLK signal is provided to each input and MSB arrangement $222_{1-N}$ while x delay line taps are provided to each of the LSB and decode arrangements $224_{1-N}$. It is noted that only a single delay line arrangement is used, which advantageously reduces circuitry requirements.

Figure 4:
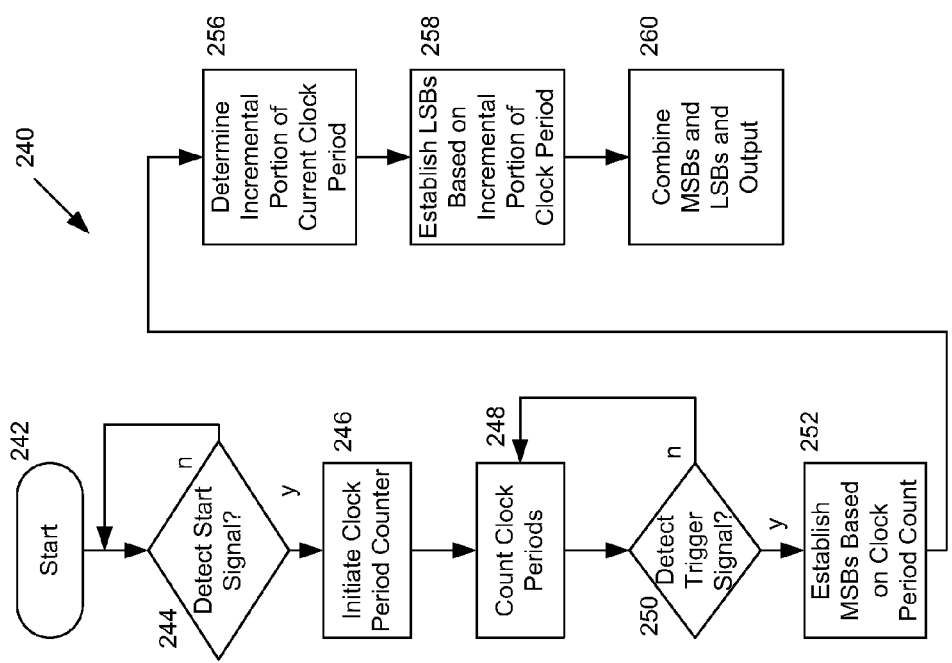
FIG. 4 is a flow diagram that further illustrates the operation of the system of FIG. 1.

FIG. 4 is a flow diagram, generally indicated by the reference number 240, which further illustrates the operation of system 10 with additional reference to FIG. 1. Following start 242, at 244, the process monitors for the occurrence of the start signal on line 42 of FIG. 1. Once the start signal has been detected, operation moves to 246 which clears and initiates counter 20 and clears flip-flops $T_1$-$T_x$ to prepare the system for measurement of the charge that is present in memory cell 12. At 248, counter 20 begins counting full (e.g., integral) clock periods and outputs the count on lines $b_3$-$b_6$. Counter operation loops through steps 248 and 250 such that step 250 monitors for the occurrence of a change in state of a trigger signal on line 44 (e.g., comparator 18 changing its output state). Once step 250 detects the change in state of the trigger signal, the count currently held by counter 20 is latched and used at 252 to establish the MSBs which are provided to decoder 54. At 256, flip-flops $FF_1$-$FF_x$ are read by decoder 54 to establish when the change in state of the trigger signal occurred in the final clock period. At 258, the flip-flop outputs are used by the decoder with Tables 1 and 2 to determine the LSBs. At 260, the MSBs and the LSBs are combined (e.g., the LSBs are appended to the MSBs) to provide an output that represents a sensed state of (e.g., the amount of charge in) memory cell 12. The process implements the counting of integral clock periods using a counter that can be off-the-shelf to establish the most significant bits with additional circuitry that can establish the least significant bits to any resolution that is desired by dividing the clock period in which counting is terminated into increments of a clock period and establishing the particular increment during which the count was terminated.

Figure 5:
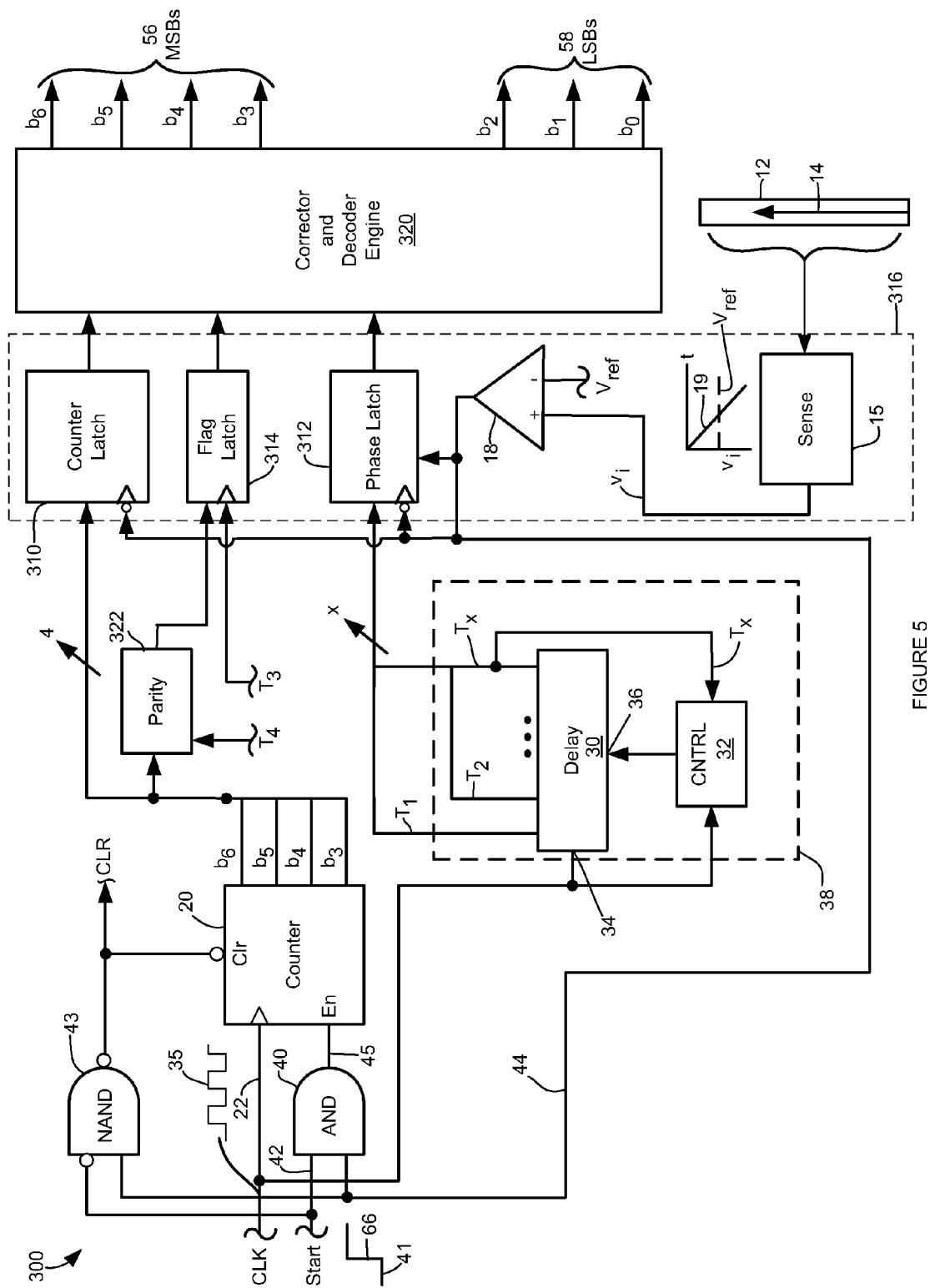
FIG. 5 is a block diagram which illustrates one embodiment of a system for converting the time duration of an input interval to digital form, for example, in the context of sensing a nonvolatile memory and which accommodates correction in the instance of termination of the input interval in a way that coincides with an active edge of a clock signal or which is sufficiently close in time to the active edge of the clock signal so as to produce a potential error in the determination of the duration of the input interval.

FIG. 5 is a block diagram of another embodiment of a system, generally indicated by the reference number 300, for sensing a state of a memory cell 12. System 300, like system 10 described above, receives a number of inputs including a sense signal, such as voltage input value $V_i$, from sense circuitry, such as sense amplifier 15. It should be appreciated that a plurality of sense amps can be used and that each sense amp can be interfaced to the memory by a multiplexer, however, one sense amp 15 is shown and the multiplexer has not been shown for purposes of maintaining illustrative clarity. Input voltage $V_i$ is produced by the sense amplifier responsive to charge 14 in memory cell 12 or some other suitable physical parameter. Certain components are duplicated for each sense amp location including comparator 18, a counter latch 310, a phase latch 312 and a flag latch 314. This collection of components may be referred to as a sense amp (S/A) arrangement shown within a dashed line 316. In the present example, counter latch 310 and phase latch 314 are shown as separate components, however, this is not a requirement. For example, in place of a four bit counter latch and a four bit phase latch, a single eight bit latch can be used. It is noted that counter latch 310 and phase latch 312 are both shown as being negative edge triggered. Comparator 18 receives $V_i$ as well as reference voltage $V_{ref}$. Sense amplifier 15 produces $V_i$ as ramp output 19 having a slope that is responsive to the state of memory cell 12, such as an amount of charge 14 stored in memory cell 12. The value of the reference voltage can be based, for example, on the slope of $V_i$ for the slowest ramp to be measured, as well as the maximum time for one conversion cycle. In the present example, ramp output 19 is illustrated as negative going, although this is not a requirement. It is noted that comparator 18 changes output states when $V_i$ crosses $V_{ref}$. Delay line 30 includes output taps $T_1$-$T_x$. An input 34 of the delay line receives the CLK signal such that clock pulses 35 propagate through the delay line and are successively output on each tap. Controller 32 provides an output to a control input 36 of the delay line. The controller is configured to adjust the total delay of the delay line, as described above, such that the delay line is locked to CLK to form a Delay Locked Loop (DLL) configuration.

During operation, AND gate 40 receives Start signal 41 on line 42 and receives the output of comparator 18 on line 44. The start signal is also provided to an inverted input of a reset NAND gate 43 with the other input of the reset NAND gate also receiving the comparator output. An output 45 of AND gate 40 is connected to an enable input of counter 20. Initially, both inputs of AND gate 40 are high to enable counter 20. The output of comparator 18 is also routed to the clock (CLK) input of counter latch 310 and phase latch 312. Counter latch 310 receives counter bit lines $b_3$-$b_6$ from counter 20 while phase latch 312 receives phases from taps $T_1$-$T_x$ of delay line 30. Note that the minimum number of bits in the phase latch is equal to the value of x, the number of taps that are in use on delay line 30. While four bits provides for unambiguous decoding in the present example, a greater number of bits could be used in the phase latch. As above, for a 3 bit binary decode (N=3), four taps can be used (x=4). Only one instance of a correction arrangement, such as corrector and decoder engine 320 is used. The latter receives outputs from counter latch 310, phase latch 312 and flag latch 314. Corrector and decoder engine 320 receives the most significant bits from counter 20 via the counter latch and uses them in conjunction with the phase latch outputs to produce an overall output of MSBs 56 and LSBs 58. An output 62 of reset NAND gate 43 is active low and provided to clear counter 20, counter latch 310, phase latch 312, and a reset input of corrector and decoder engine 320. It is noted that individual connections for the Clr signal to the various components have not been shown for purposes of maintaining illustrative clarity, but are understood to be present, as needed.

As discussed above, it should be appreciated that the termination of the operation of counter 20 can take place at any time during a clock period and that the termination of the count will not generally coincide with the initiation of a clock pulse. Embodiment 300, however, is configured to accommodate the termination of the count in close time proximity to the initiation of a clock pulse. Moreover, a corrected output is provided even when the count is terminated as the active edge of the clock pulse is initiated. Counter 20 outputs four bits $b_6$-$b_3$ which represent the four most significant bits of the final value that is to be determined, if it is assumed that the final value will include 7 bits. As will be seen, embodiment 300 is configured in a way which enhances resolution by determining more precisely when the count is terminated within a single clock period while resolving any ambiguity that is introduced when the termination of counting is sufficiently close to the initiation (e.g., a triggering edge, which is sometimes also referred to as an active edge) of a clock pulse.

Figure 6:
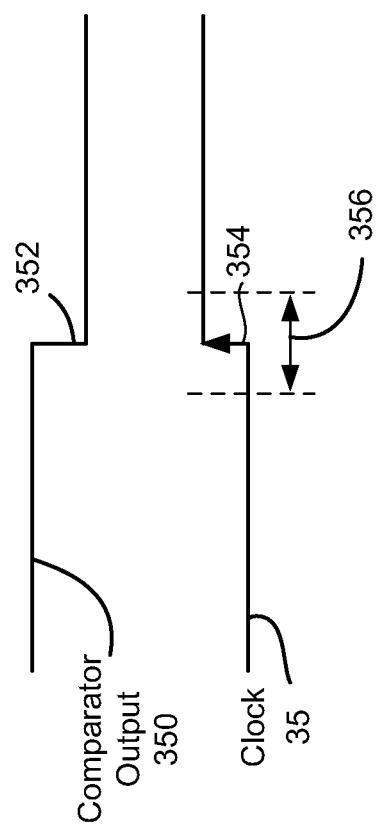
FIG. 6 is a timing diagram that illustrates a time relationship between a comparator output, which is responsive to the end of the input interval, and the active edge of the clock signal, showing an interval that represents uncertainty with respect to the position in time of the active edge of the clock signal in relation to the end of the input interval.

Turning now to the timing diagram of FIG. 6, in typical prior art implementations, it should be appreciated that a problem can occur if, in association with a particular sense circuitry arrangement, such as a sense amp (SA) arrangement, a comparator output changes state at substantially the same time that the counter is changing states. In other words, the counter changes states responsive to an active clock edge that essentially coincides with or is within a limited range of the transition in the comparator output. As illustrated by FIG. 6, a comparator output 350 changes states at a comparator transition 352. While clock 35 changes states at a transition 354, certain effects of interest may result in the clock transition potentially or effectively occurring anywhere within a window 356, represented by a double headed arrow. These effects can result from slight variations in setup and hold times, noise on signal edges, jitter of clock edges and time delays, among other causes. Thus, the counter value that is latched may not appropriately correspond to the phase value that is latched at least for the reason that the time relationship between the comparator transition and the triggering clock signal edge may be different at different locations in system 300 of FIG. 5 as a result of these effects, as will be further described immediately hereinafter.

Turning to FIG. 2b in conjunction with FIG. 5, assuming that a comparator transition 352 (shown as a dashed line in FIG. 2b) occurs on a triggering edge of the clock, the comparator transition is concurrent with a transition of the phase 4 output (from tap T4) of delay line 30. Under these circumstances, the 4 bit phase value is actually correct at either one of two possible values which are only one bit apart. For example, 0001 versus 0000. If the counter value is latched just after the counter has incremented, the correct phase value from delay line 30 would be all phases low (T1 thru T4 equal to 0000 or binary decode 000), whereas if the counter value is latched just before the counter incremented, the correct phase value from delay line 30 would be all phases low except phase 4 (from tap T4), which would be high (0001) or binary decode 111. Whenever the counter value and phase value are not latched in proper time relation, for example, due to the effects discussed above, an error has occurred which can be equal to a full count of counter 20. For example, an actual count of 1001000 when in an error condition could be 1001111. Thus, the error is one bit less than a full count increment of counter 20. As another example, an actual count of 1000111 when in an error condition could be 1001111 which is also a full one count less error in terms of the count of counter 20. As will be seen, a method and associated apparatus have been brought to light herein for correcting such error conditions. In one embodiment, a limited amount of circuitry can be used, which can be beneficial in terms of preserving active device real estate, that is, in devices where there is limited area available in which to receive the circuitry. For the embodiment of FIG. 5, only the components of sense amp arrangement 316 are duplicated. In this regard, only one instance of corrector and decoder engine 320 is used.

Referring to Table 1 and for the circumstances described above with regard to FIG. 6, if it is assumed that counter 20 is latched at a count x (meaning that the value of the counter was latched before it incremented), the phase T4 should be high (output state S8). On the other hand, if the counter is latched at a count x+1 (meaning that the counter was latched after it incremented), the phase T4 should be low (output state S1). If these conditions are not satisfied, then the A/D output is in error in one direction or the other, being 7 counts too high or 7 counts too low.

Referring to FIG. 5, only one instance of a parity generator 322 is used in the present embodiment. As discussed above, what is duplicated at each sense amp location is one 8 bit latching arrangement (4 bits for the MSB counter bits and 4 bits for the delay line phase bits, either in separate latches or a single latch) and one flag latch (1 bit). With reference to FIG. 2b, it is assumed that flag latch 314 is clocked on the positive going edge of phase T3 (which is spaced far away in time from a subsequent positive going clock edge). Using this edge of T3 allows the output of counter 20 to be stable for purposes of determining the parity of the output using parity generator 322. Flag latch 314 then stores the value of the parity for the state of the counter at the triggering edge of phase 3 (from tap T3). Parity is well known in the art, and as described herein can be either odd or even. Parity can be the number of 1s in the counter output being either an odd number or even number, or it can be the number of 0s in the counter output being either an odd number or an even number. When the counter is Gray coded, then parity exactly alternates as the counter increments, count by count. Therefore, counter 20 for the embodiment of FIG. 5 can be Gray coded (as opposed to binary coded). In other embodiments, a binary counter may be accommodated.

TABLE 3

Correction Table

| Condition | Flag Value | Current Counter Parity | Parity Status | Output State (FIG. 2b) | Correction Action |
|---|---|---|---|---|---|
| 1 | X | X | X | 2, 3, 4, 5, 6, 7 | None |
| 2 | 0 | 0 | matching | 1 | Phase T4 = 1 |
| 3 | 0 | 0 | matching | 8 | None |
| 4 | 1 | 1 | matching | 1 | Phase T4 = 1 |
| 5 | 1 | 1 | matching | 8 | None |
| 6 | 0 | 1 | opposite | 1 | None |
| 7 | 0 | 1 | opposite | 8 | Phase T4 = 0 |
| 8 | 1 | 0 | opposite | 1 | None |
| 9 | 1 | 0 | opposite | 8 | Phase T4 = 0 |

X = Don't Care

Referring to Table 3 in conjunction with FIGS. 2a and 5, it should be appreciated the phase value initially establishes whether a potential error may be present. In particular, no correction is needed when the latched phase value corresponds to one of states S2-S7. However, whenever a phase value corresponding to either state S1 or state S8 is latched, there is the possibility of a potential error. In continuing the determinations, a comparison of the value of the flag latch with a current value of the parity obtained from counter 20 reveals whether or not the counter incremented. That is, if the flag latch value matches the current counter parity value, the counter did not increment between the triggering edge of phase 3 and the latching of the phase value. On the other hand, if the flag latch value is opposite the current counter parity value, the counter did increment between the triggering edge of phase 3 and the latching of the phase value. At the same time, a phase value corresponding to state S1 is consistent with an opposite parity determination (conditions 6-9 in Table 3) while a matching parity determination is consistent with a phase value corresponding to S8. When a phase value corresponding to S8 is latched and the value in the flag latch matches the current counter parity value, no error is present and no correction action is needed as per conditions 3 and 5 in Table 3. Similarly, when a phase value corresponding to S1 is latched and the value in the flag latch is opposite the current counter parity value, no error is present and no correction action is needed as per conditions 6 and 8 in Table 3. Conversely, when a phase value corresponding to S8 is latched and the value of the flag latch is opposite the current counter parity value, an error is present as per conditions 7 and 9 in Table 3 such that the correction action sets the value of phase 4 to 0. Similarly, when a phase value corresponding to S1 is latched and the value of the flag latch matches the current counter parity value, an error has occurred as per conditions 2 and 4 in Table 3 such that the correction action sets the value of phase 4 to 1. It should be appreciated that the procedure that is embodied by Table 3 can be embodied in more than one manner such as, for example, through a software implementation or a hardware implementation, as will be further described at appropriate points hereinafter.

The determinations and corrections performed and described with regard to Table 3 can be performed at any suitable physical location after all of the data has been latched. That is, corrector and decoder engine 320 can be located remotely from a given sense amp arrangement. Referring to FIG. 5 and Table 3, it should be apparent that 9 bits of data are in use in making the correction determinations. Of course, the embodiment of FIG. 5 and Table 2 is provided by way of example and is not intended as limiting. With the present disclosure in hand, one of ordinary skill in the may readily produce other embodiments. For example, there are other configurations for a 7 bit A/D system which could use a counter having a width that is different than 4 bits with the remaining bits being made up by an appropriate width phase latch. Further, one of ordinary skill in the art may implement a different A/D converter such as, for example, an 8 bit system which might be configured using a 5 bit counter, 4 bits of phase data, and 1 bit of flag data (1 parity bit). Accordingly, the number of A/D bits and the configuration of the arrangement of the bits can vary while remaining within the scope of this overall disclosure and the appended claims.

Corrector and decoder engine 320 can reside within the same non-volatile memory (NVM) device as the remaining A/D components (hereinafter, the A/D components) of FIG. 5 reside. In one embodiment, system 300 of FIG. 5 can be co-integrated as part of an overall nonvolatile memory device. In another embodiment, the A/D components can be co-integrated as part of an overall nonvolatile memory device while corrector and decoder engine 320 is located elsewhere. For example, the corrector and decoder engine can be provided as part of a memory controller. In still another embodiment, a portion of the A/D components can be co-integrated, along with corrector and decoder engine 320 in a nonvolatile memory device while the remainder of the A/D components can be located elsewhere. One benefit of system 300 being provided as part of a nonvolatile memory device resides in the ability to correct the data (assuming 9 bits) and output the data as a final 7 bit A/D value, so if the final data is sent to an outside device, there is less data to send, which improves throughput performance, although this not required. In one embodiment, all of the intelligence necessary for correction of an error followed by decoding can be performed at one location and at the same time which is benefited by limiting duplication of circuitry as described herein. The corrector engine and decoder can be implemented in pure hardware, firmware, or a combination thereof.

Figure 7:
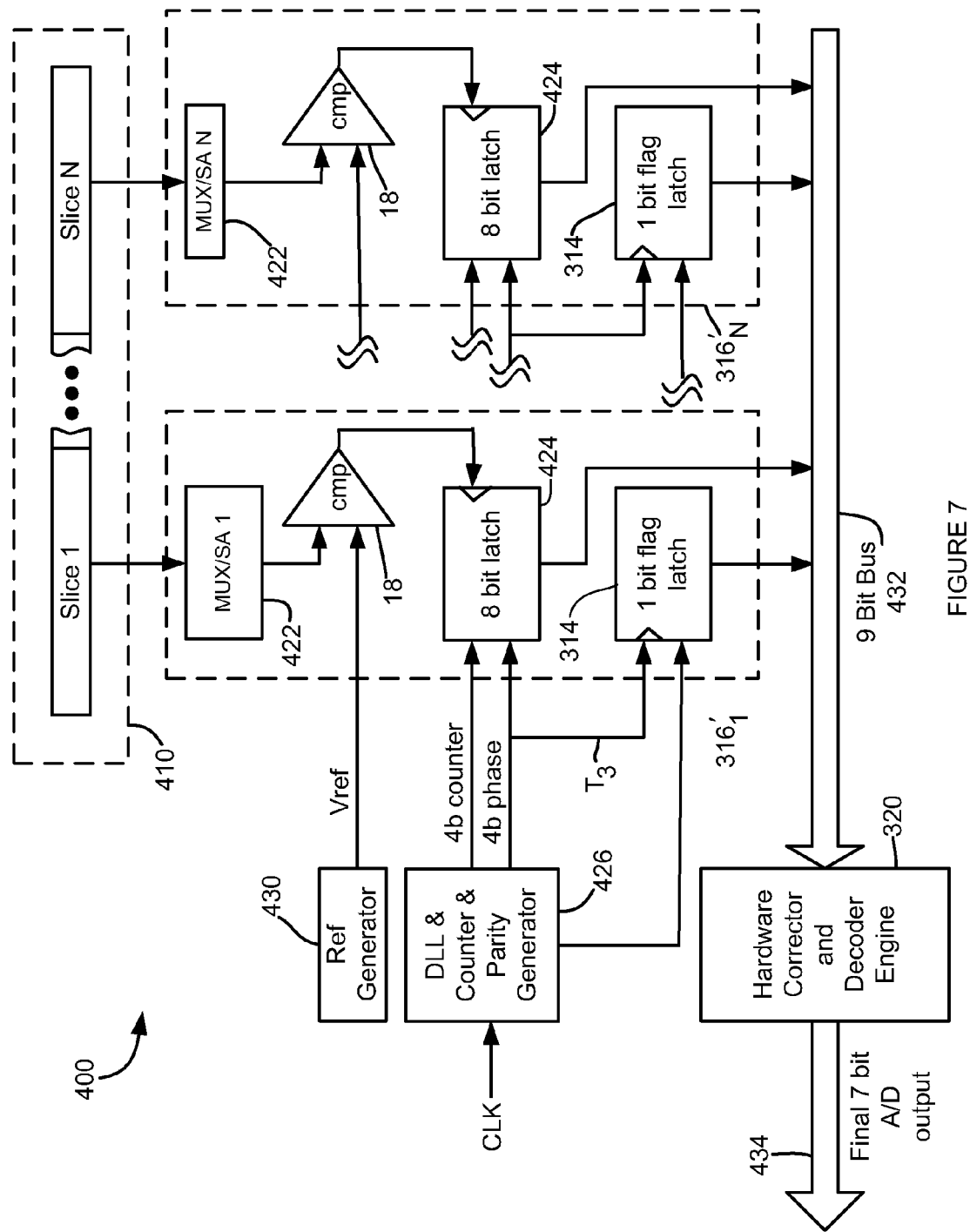
FIG. 7 is a block diagram which illustrates one embodiment of a system for converting the time duration of an input interval to digital form and which, like the embodiment of FIG. 5, accommodates correction in the instance of termination of the input interval in a way that coincides with an active edge of a clock signal or which is sufficiently close in time to the active edge of the clock signal so as to produce a potential error in the determination of the duration of the input interval. In this embodiment, a nonvolatile memory is being sensed on a slice by slice basis.

FIG. 7 is a block diagram that illustrates certain components of FIG. 5 in one embodiment of the analog to digital converter that is generally indicated by the reference number 400. In this embodiment, as is also the case for embodiment 300 of FIG. 5, a nonvolatile memory 410 is read on a slice by slice basis. In this embodiment, N slices are read substantially simultaneously. For each slice, a sense circuitry arrangement $316'_1$ to $316'_N$ includes a multiplexer and sense amplifier 422 (e.g., including aforedescribed sense amplifier 15, comparator 18, an 8 bit latch 424, and flag latch 314. It should be appreciated, with reference to FIG. 5 that, in another embodiment, counter latch 310 and phase latch 312 can collectively serve as 8 bit latch 424. A component block 426 includes delay line 30, counter 20 and parity generator 322, which are not individually represented, to provide counter and phase data to eight bit latches 424. Parity is provided to flag latches 314 along with the phase from the T3 tap in order to stably latch the counter parity, as described above. A reference generator 430 produces $V_{ref}$ for use by comparators 18. Data obtained by reading each slice can be transferred to hardware corrector and decoder engine 320, for example, on a 9 bit bus 432 to generate a final 7 bit A/D converter output at 434.

Figure 8:
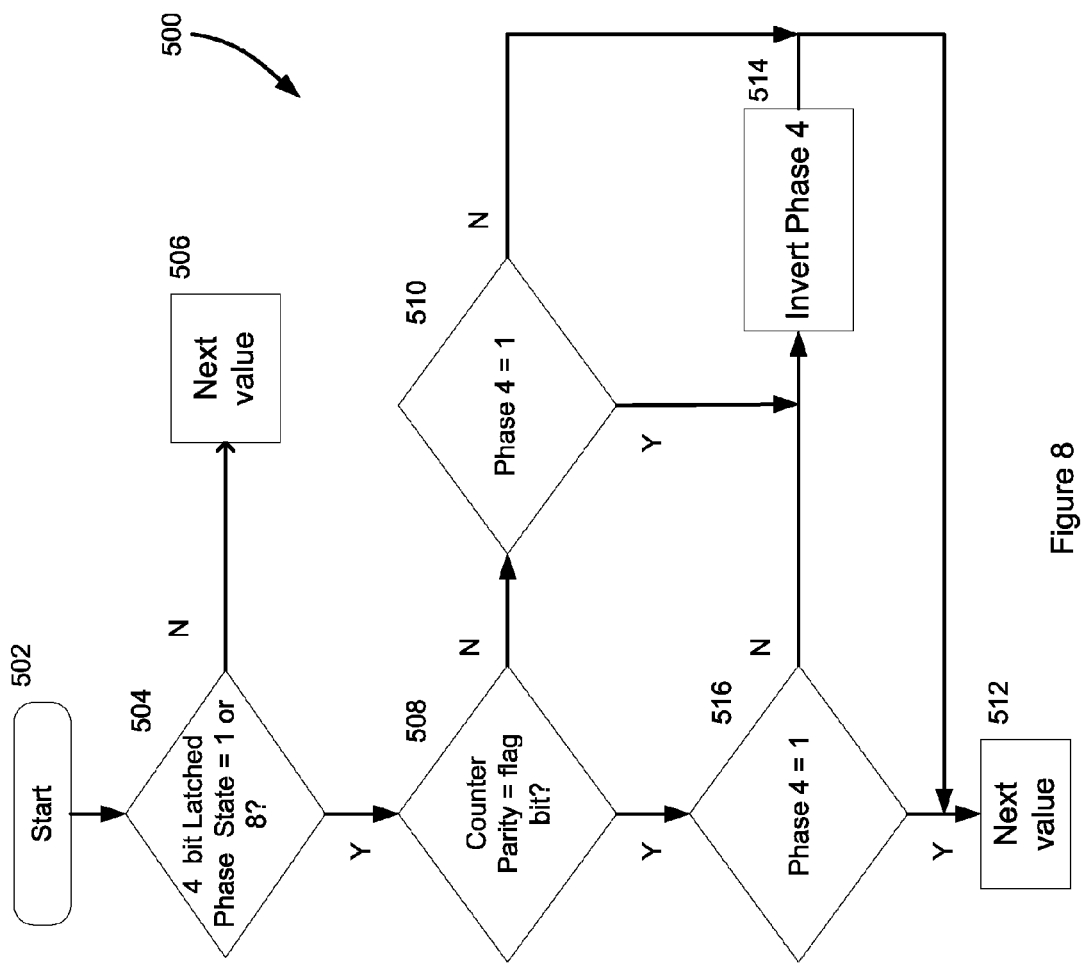
FIG. 8 is a flow diagram that represents one embodiment of a method operating in the systems of FIGS. 5 and 7, according to the present disclosure.

FIG. 8 is a flow diagram, generally indicated by the reference number 500, which illustrates one embodiment of a method according to the present disclosure which describes the technique described above with regard to FIGS. 5-7 for one instance of latched data. The method starts at 502 and proceeds to 504 which determines whether the latched phase value is equal to the output states of either S1 or S8 in FIG. 2b. If S1 or S8 is not detected the process ends at 506 and returns to start 502 if another determination is to be made. If either S1 or S8 is detected, step 508 then determines if the current counter parity value is equal to the value of the parity flag bit. If not, the procedure goes to step 510 which determines whether phase 4 has a latched value of 1. If the latched value of phase 4 is 0, the process ends for the current value and awaits a subsequent value at 512. On the other hand, if step 510 determines that phase 4 has the value of 1, step 514 inverts the phase 4 value to 0 and operation then transfers to step 512.

Returning to step 508, if the counter parity value is equal to the value of the parity flag bit, step 516 determines whether the current latched value of phase 4 is equal to 1. If not step 514 inverts phase 4 to the value of 1 and execution proceeds to step 512. If step 516 determines that the current latched value of phase 4 is equal to 1, execution proceeds to step 512. As discussed above, method 500 may be implemented in any suitable manner such as, for example, exclusively in hardware, exclusively in software, or in a combination of hardware and software.

Figure 9:
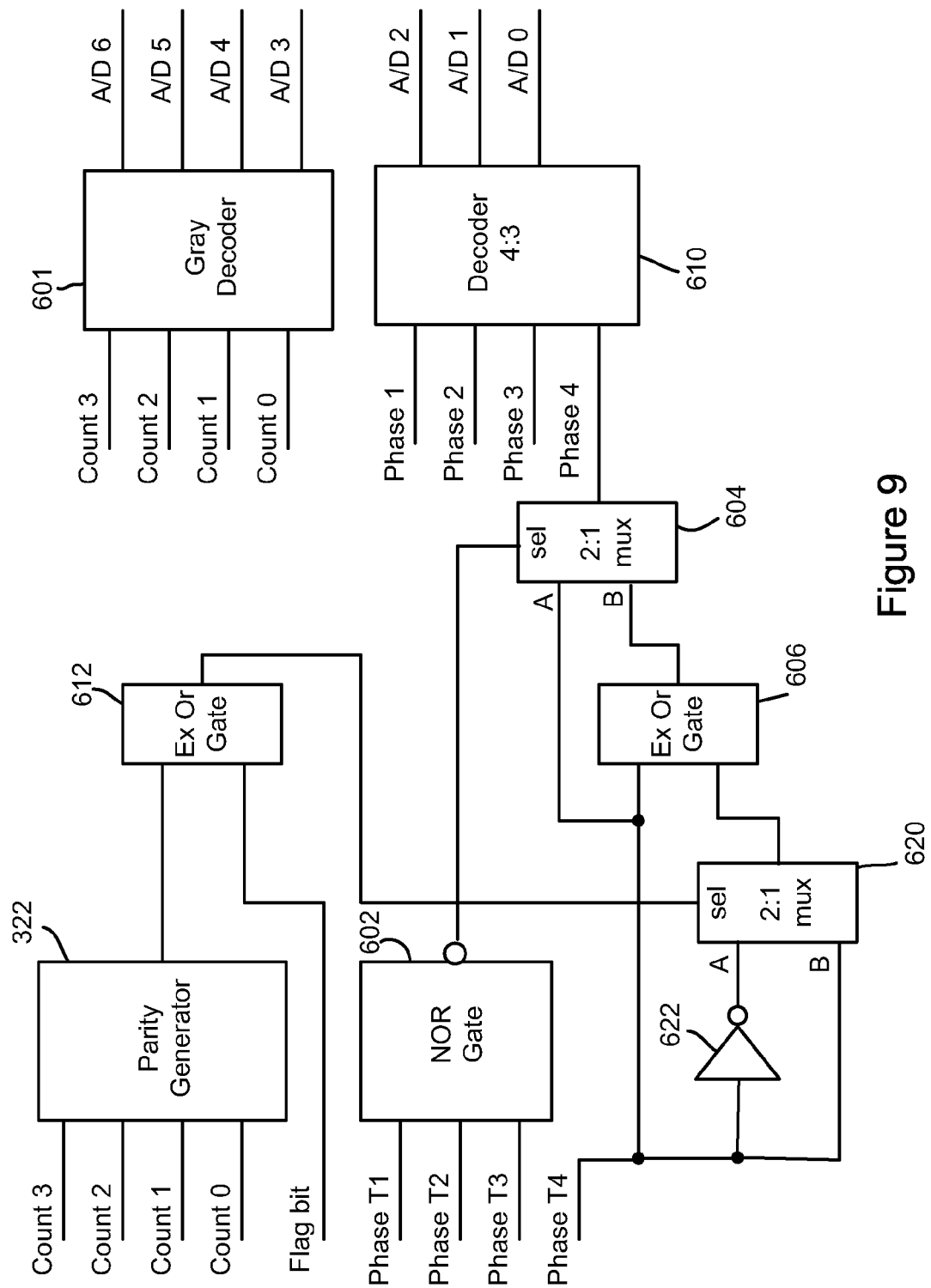
FIG. 9 is a block diagram of a hardware arrangement which implements the flow diagram of FIG. 8, according to the present disclosure.

Attention is now directed to FIG. 9 which illustrates a logic circuit that is generally indicated by the reference number 600 and which implements method 500 in a hardware form. A Gray decoder 601 outputs A/D bits 3-6 based on the output of counter 20. Parity generator 322 receives the four counter bits, as indicated, while a NOR gate 602 receives the four phase bits which are indicated as Phase T1-T4. The hardware will immediately determine if a possible correction is required by looking at a portion of the phase information returned (T1 thru T3). As per table 3, there is no error if the phases are anything other than state 1 or state 8 (per FIG. 2b), as determined by NOR gate 602. For either state 1 or state 8, phases T1, T2, and T3 should be zero. If the NOR gate output is a logical "1", that is the case. If the output is a zero, then one of the phases $T_1$-$T_3$ should not be at 0, so there is no need for a correction. For the latter case, a 2:1 multiplexer 604 is caused to select phase 4 via input A without correction.

In the case of a possible error that should be corrected, the corrector engine reverses the polarity of phase 4 by using an exclusive OR gate 606. When looking at FIG. 2b by inspection, it can be easily seen why this is the case. There can only be a possible error if the comparator signal latching transition (high to low) as seen in FIG. 6 occurs at the time the counter is changing states or very near that time responsive to a clock transition. At all other times, only the phases and not the counter may be changing states, so the data is correct. When phases T1 thru T3 are all low, the system is in state S1 or state S8 (per FIG. 2b), which corresponds to a binary decode of 000 or 111. As can be seen in the Table 3, there are only a total of 8 possible cases that can occur and, of these, one-half or four cases will require a correction.

With continuing reference to FIG. 9, if the output of NOR gate 602 is "0", there is no correction required, and phase 4 is passed directly through the 2:1 multiplexer 604 via input A to a 4:3 decoder 610 without modification. In the case of NOR gate 602 outputting a "1", then the B input of multiplexer 604 is selected such that phase 4 can be modified. Again referring to Table 3, there are several conditions to consider, as shown in the table. Conditions 2, 3, 4, and 5 involve the flag latch bit being the same as the counter parity bit, while conditions 6, 7, 8, and 9 involve the flag latch bit being opposite the counter parity bit. In the hardware of FIG. 9, an exclusive-or gate 612, following parity generator 322, determines which case is exhibited. If the output of ex-or gate 612 is a "0", then one of conditions 2, 3, 4, or 5 is present in which the parity of the flag latch (that is, the parity of the counter before it might have incremented) and the parity of the latched value of the counter are equal. In these cases, because the flag value and the current parity values match, the counter value latched could not have been an incremented value. Referring to FIG. 2b again, if the counter value did not change, then the correct state of the phases is output state S8, in which phase 4 is a "1". The output of exclusive-or gate 612 selects the A input of a multiplexer 620. If phase 4 is a zero, then it is an incorrect state such that an inverter 622 inverts input A of multiplexer 620 to a "1" which is outputted from multiplexer 620 and becomes the input to a lower input (as shown) of exclusive-or gate 606. This serves to invert the value of phase 4 provided to exclusive-or 606 such that it generates a "1" as its output. Because multiplexer 604 has been caused to select its B input, the final phase 4 output into 4:3 decoder 610 has been corrected. If one refers to Table 3 and the hardware of FIG. 9, it can be seen that the hardware corrects errors as per Table 3 and in a manner that is consistent with the flow diagram of FIG. 8.

It should be apparent that the embodiments and associated methods disclosed herein may be provided in a variety of different configurations and modified in an unlimited number of different ways, and that the present invention may be embodied in many other specific forms without departing from the spirit or scope of the invention. For example, as noted above, the concepts, as taught herein, are readily adaptable to essentially any type of memory cell that stores information in an essentially analog form, whether currently available or yet to be developed. As another example, the various functions that are represented in the figures can be distributed among physical componentry in a wide variety of ways and the figures are not intended to be limiting in this manner. Therefore, the present examples and methods are to be considered as illustrative and not restrictive, and the invention is not to be limited to the details given herein.

What is claimed is:

1. In a system in which a counter configuration operates in cooperation with a delay configuration such that the counter configuration counts based on a given clock signal characterized by a given clock speed and a given clock interval to provide a given data output resolution with respect to timing an input interval as limited by the given clock speed and the counter configuration counts responsive to a selected clock edge in each given clock interval, and said delay configuration is used to divide the given clock interval to provide a delay configuration output that produces an enhanced data output having an enhanced resolution, with respect to timing the input interval, that is greater than the data output resolution that is available based on the given clock speed, an apparatus comprising:
   a correction arrangement configured to (i) monitor at least the delay configuration output for detecting a particular time relationship between an endpoint of said input interval and a nearest occurrence of the selected clock edge in the given clock signal that is indicative of at least a potential error in the enhanced data output and (ii) determining if the potential error is an actual error for subsequent use in correcting the enhanced data output.

2. The apparatus of claim 1 wherein said correction arrangement is configured to correct the enhanced data output responsive to determining that the potential error is an actual error.

3. The apparatus of claim 1 wherein the delay configuration includes a delay line having a plurality of phase outputs and wherein the correction arrangement is configured to latch the phase outputs responsive to the endpoint of the input interval and to detect the particular time relationship based on a state of at least one of the phase outputs as latched responsive to the endpoint of the input interval.

4. The apparatus of claim 3 wherein the correction arrangement includes
   a parity generator for determining a parity state of the count of the counter configuration,
   a flag latch for storing the parity state of the counter as a latched parity state,
   a trigger arrangement to cause the flag latch to latch the parity state of the count of said counter configuration responsive to a selected one of the phase outputs such that the selected one of the phase outputs triggers the flag latch in a spaced apart time relationship leading the selected edge of the clock signal so that the count of the counter is stable when the parity state is latched by the flag latch, and
   an arrangement for obtaining a current parity value of a current output state of the count of the counter configuration responsive to detecting the endpoint of said input interval and for comparing the current parity value to the latched parity state as part of establishing if said potential error is said actual error.

5. The apparatus of claim 4 wherein the correction arrangement is configured to correct the enhanced data output based on (i) whether the current output state of the counter was incremented responsive to the endpoint of the input interval and (ii) whether the latched phase count is consistent with the current output state of the counter.

6. The apparatus of claim 5 wherein, for each clock interval of the given clock signal, the phase outputs change successively through a series of phase states beginning with an initial phase state responsive to the selected edge in each given clock interval and ending with a final phase state that leads up to a next selected edge of the given clock signal and said correction arrangement is configured to correct the enhanced data output (i) when the latched parity state matches the current parity value and the latched phase count corresponds to the initial phase count by changing the initial phase count to the final phase count in the enhanced data output and (ii) when the latched parity state is opposite the current parity value and the latched phase count corresponds to the final phase count by changing the final phase count to the initial phase count in the enhanced data output.

7. The apparatus of claim 1 wherein the counter configuration is configured to count in a Gray code count and said correction arrangement is configuring for determining if the potential error is an actual error based on said Gray code count.

8. A sense circuitry arrangement including the apparatus of claim 1 for establishing a state of a memory cell wherein the state comprises an amount of charge in the memory cell.

9. The sense circuitry arrangement of claim 8 wherein said memory cell forms one memory cell in a memory having a plurality of memory cells that are arranged in memory slices and the sense circuitry arrangement further comprising a multiplexer configured to select the memory cell in a slice of said memory.

10. In a system in which a counter configuration operates in cooperation with a delay configuration such that the counter configuration counts based on a given clock signal characterized by a given clock speed and a given clock interval to provide a given data output resolution with respect to timing an input interval as limited by the given clock speed and the counter configuration counts responsive to a selected clock edge in each given clock interval, and said delay configuration is used to divide the given clock interval to provide a delay configuration output that produces an enhanced data output having an enhanced resolution, with respect to timing the input interval, that is greater than the data output resolution that is available based on the given clock speed, a method comprising:
- monitoring at least the delay configuration output for detecting a particular time relationship between an endpoint of said input interval and a nearest occurrence of the selected clock edge in the given clock signal that is indicative of at least a potential error in the enhanced data output; and
- determining if the potential error is an actual error for subsequent use in correcting the enhanced data output.

11. The method of claim 10 including correcting the enhanced data output responsive to determining that the potential error is an actual error.

12. The method of claim 10 wherein the delay configuration includes a delay line having a plurality of phase outputs and said determining includes latching the state of the phase outputs at the endpoint of the input interval and detecting the particular time relationship based on a state of the phase outputs as latched responsive to the endpoint of the input interval.

13. The method of claim 10 wherein said determining includes
- establishing a parity state of the count of the counter configuration and latching the parity state responsive to a selected one of the phase outputs by using the selected one of the phase outputs to trigger the flag latch in a spaced apart time relationship leading the selected edge of the clock signal so that the count of the counter is stable when the parity state is latched,
- latching a current parity of a current output state of the count of the counter responsive to the endpoint of said input interval,
- comparing the current parity of the count of the counter, as latched, to said parity state as part of determining if said potential error is said actual error.

14. The method of claim 13 further comprising:
- correcting the enhanced data output based on (i) whether the current output state of the counter was incremented responsive to the endpoint of the input interval and (ii) whether the latched phase count is consistent with the current output state of the counter.

15. The apparatus of claim 14 wherein, for each clock interval of the given clock signal, the phase outputs change successively through a series of phase states beginning with an initial phase state responsive to the selected edge in each given clock interval and ending with a final phase state that leads up to a next selected edge of the given clock signal and correcting the enhanced data output (i) when the latched parity state matches the current parity value and the latched phase count corresponds to the initial phase count by changing the initial phase count to the final phase count in the enhanced data output and (ii) when the latched parity state is opposite the current parity value and the latched phase count corresponds to the final phase count by changing the final phase count to the initial phase count in the enhanced data output.

16. A sense circuitry arrangement comprising:
- sense circuitry configured to produce a sense signal responsive to a state of a memory cell;
- a comparator configured to change a state of a trigger signal responsive to a comparison of the sense signal to a reference signal;
- a first latch configured to:
  - latch a count corresponding to a number of pulses of a clock signal in an interval between starting an operation to sense the state of the memory cell and changing the state of the trigger signal to end the interval such that a duration of said interval is indicative of said state of the memory cell and wherein the count is terminated responsive to the change of state of the trigger signal; and
  - latch a phase of the clock signal responsive to the change of the state of the trigger signal; and
- a second latch configured to latch a parity of the count before the change of the state of the trigger signal such that comparing the latched parity of the count to the latched phase of the clock signal is indicative of the presence of a conversion error in determining the state of the memory cell.

17. The sense circuitry arrangement of claim 16, wherein the latched count, the latched phase, and the latched parity are provided to a correction arrangement, wherein the correction arrangement is configured to:
- compare the latched parity of the count before the change of the state of the trigger signal to another parity of the latched count responsive to the change of state of the trigger signal; and
- correct the latched phase responsive to the comparison.

18. A sense circuitry arrangement comprising:
- sense circuitry configured to produce a sense signal responsive to a state of a memory cell;
- a comparator configured to change a state of a trigger signal responsive to a comparison of the sense signal to a reference signal;
- a first latch configured to:
  - latch a count corresponding to a number of pulses of a clock signal in an interval between starting an operation and changing the state of the trigger signal, wherein the count is terminated responsive to the change in state of the trigger signal; and
  - latch a phase of the clock signal when the state of the trigger signal changes; and
- a second latch configured to latch a parity of the count during a particular period of the clock signal before the change in the state of the trigger signal.

19. The sense circuitry arrangement of claim 18, wherein the parity is provided by a parity generator coupled to a counter, wherein the counter provides the count.

20. The sense circuitry arrangement of claim 18, wherein the phase of the clock signal is provided by a delay section.

21. The sense circuitry arrangement of claim 20, wherein the delay section comprises:
- a delay line configured to receive the clock signal and provide the phase on a plurality of taps; and
- a controller configured to adjust the total delay of the delay line to match one-half the period of the clock signal.

22. The sense circuitry arrangement of claim 18, wherein the first latch comprises:
- a counter latch configured to latch the count; and
- a phase latch configured to latch the phase.

23. The sense circuitry arrangement of claim 18, wherein the second latch comprises a flag latch.

24. The sense circuitry arrangement of claim 18, wherein the latched count, the latched phase, and the latched parity are provided to a correction arrangement, wherein the correction arrangement is configured to:
- compare the latched parity from the second latch to a parity of the latched count; and
- correct the latched phase responsive to the comparison.

25. The sense circuitry arrangement of claim 24, wherein the correction arrangement comprises a corrector and decoder engine.

26. A correction arrangement configured to:
compare a latched parity to a parity of a latched count; and
correct a latched phase responsive to the comparison, wherein
the latched parity, latched count and the latched phase are provided by a sense circuitry arrangement, wherein the sense circuitry arrangement is configured to:
produce a sense signal responsive to a state of a memory cell; and
change a state of a trigger signal responsive to a comparison of the sense signal to a reference signal, wherein the latched count comprises a count corresponding to a number of pulses of a clock signal in an interval between starting an operation and changing the state of the trigger signal, wherein the count is terminated within a particular period of the clock signal, wherein the latched phase comprises a phase of the clock signal when the state of the trigger signal changes, and wherein the latched parity comprises a parity of the count during the particular period of the clock signal.

27. An apparatus comprising:
a sense circuitry arrangement comprising:
sense circuitry configured to produce a sense signal responsive to a state of a memory cell;
a comparator configured to change a state of a trigger signal responsive to a comparison of the sense signal to a reference signal;
a first latch configured to:
latch a count corresponding to a number of pulses of a clock signal in an interval between starting an operation and changing the state of the trigger signal, wherein the count is terminated responsive to the change in state of the trigger signal; and
latch a phase of the clock signal when the state of the trigger signal changes; and
a second latch configured to latch a parity of the count during a particular period of the clock signal before the change in the state of the trigger signal; and
a correction arrangement, wherein the correction arrangement is configured to:
compare the latched parity of the count before the change of the state of the trigger signal to a parity of the latched count; and
correct the latched phase responsive to the comparison.

28. The apparatus of claim 27, wherein the correction arrangement comprises a corrector and decoder engine.

29. The apparatus of claim 28, wherein the apparatus comprises a memory device.

30. The apparatus of claim 28, wherein the sense circuitry arrangement is located in a memory device and wherein the corrector and decoder engine is located in a memory controller.

* * * * *

UNITED STATES PATENT AND TRADEMARK OFFICE
CERTIFICATE OF CORRECTION

| | | |
|---|---|---|
| PATENT NO. | : 8,522,087 B2 | Page 1 of 1 |
| APPLICATION NO. | : 13/019873 | |
| DATED | : August 27, 2013 | |
| INVENTOR(S) | : Larry J. Koudele and Robert B. Eisenhuth | |

It is certified that error appears in the above-identified patent and that said Letters Patent is hereby corrected as shown below:

In the Claims

Column 15, line 43, In Claim 15, replace the phrase "The apparatus of claim 14 wherein," with the phrase --The method of claim 14 wherein,--

Signed and Sealed this
Twenty-seventh Day of May, 2014

Michelle K. Lee
*Deputy Director of the United States Patent and Trademark Office*